United States Patent
Jang et al.

(10) Patent No.: US 7,545,230 B2
(45) Date of Patent: Jun. 9, 2009

(54) BACK-GATE COUPLING VOLTAGE CONTROL OSCILLATOR

(75) Inventors: Sheng-Lyang Jang, Taipei (TW);
Shao-Hua Lee, Taipei County (TW);
Yun-Hsueh Chuang, Taoyuan County (TW); Chung-Ching Chiu, Nantou County (TW)

(73) Assignee: National Taiwan University of Science and Technology, Taipei (TW)

( * ) Notice: Subject to any disclaimer, the term of this patent is extended or adjusted under 35 U.S.C. 154(b) by 107 days.

(21) Appl. No.: 11/671,252

(22) Filed: Feb. 5, 2007

(65) Prior Publication Data

US 2008/0111644 A1  May 15, 2008

(30) Foreign Application Priority Data

Oct. 23, 2006  (TW) ............................... 95138947 A

(51) Int. Cl.
*H03B 5/18* (2006.01)
(52) U.S. Cl. ............ 331/177 V; 331/36 C; 331/117 FE; 331/167
(58) Field of Classification Search ........... 331/116 FE, 331/117 FE, 117 R, 167, 177 V, 185, 36 C
See application file for complete search history.

(56) References Cited

U.S. PATENT DOCUMENTS

| | | | |
|---|---|---|---|
| 7,342,462 B1* | 3/2008 | Chen | 331/45 |
| 2002/0145481 A1* | 10/2002 | Murgulescu | 331/117 R |
| 2003/0042989 A1* | 3/2003 | Sakurai | 331/175 |
| 2005/0046494 A1* | 3/2005 | Lee et al. | 331/46 |
| 2007/0257742 A1* | 11/2007 | Cha et al. | 331/167 |
| 2008/0042769 A1* | 2/2008 | Berens | 331/185 |

OTHER PUBLICATIONS

Article titled "A 5.2GHz Low Voltage and Low Power Differential Colpitts VCO" jointly authored by Lee et al., Cross Strait Tri-Regional Radio Science and Wireless Technology Conference 2006, Department of Electronic Engineering National Taiwan University of Science and Technology, Taipei, Taiwan (R.O.C.), pp. 33-36.

* cited by examiner

*Primary Examiner*—James Cho
*Assistant Examiner*—Jany Tran
(74) *Attorney, Agent, or Firm*—J.C. Patents

(57) ABSTRACT

A voltage control oscillator (VCO) includes a VCO circuit and a back-gate coupling circuit, wherein the VCO circuit includes at least a first transistor, a second transistor and a resonant cavity formed by an inductor and a capacitor. The back-gate coupling circuit is formed by a plurality of capacitors and a plurality of resistors. In the embodiments of the present invention, the capacitors are coupled to the back-gate terminals of the first transistor and the second transistor, so as to reduce the power consumption and the phase noise of the VCO.

18 Claims, 6 Drawing Sheets

BACK-GATE COUPLING VOLTAGE CONTROL OSCILLATOR

CROSS-REFERENCE TO RELATED APPLICATION

This application claims the priority benefit of Taiwan application serial no. 95138947, filed Oct. 23, 2006. All disclosure of the Taiwan application is incorporated herein by reference.

BACKGROUND OF THE INVENTION

1. Field of the Invention

The present invention generally relates to a voltage control oscillator (VCO), and more particular, to a VCO including a back-gate coupling circuit.

2. Description of Related Art

Along with the rapid progress of radio frequency technology (RF technology), the demand on the RF products with high performance and extreme-low cost is increased. Herein the phase noise of an OCR is a key factor affecting the quality of transmitting and receiving information and the reliability of an RF product. Therefore, it has become the most important research topic to develop a VCO with low power-consumption and low phase noise.

In terms of the differential LC-tank VCO which has been developed recently, it is classified into three types, namely cross-coupling VCO, balanced VCO and Transformer-based VCO.

(1) Cross-coupling VCO, shown as FIGS. 1A-1C.

FIG. 1A is a schematic circuit drawing of a conventional transconductance coupling LC-tank VCO with NMOS transistor architecture, wherein inductors and capacitors form a resonant cavity and the resonant cavity is coupled by two NMOS transistors to achieve the differential output effect.

FIG. 1B is a schematic circuit drawing of a conventional transconductance coupling LC-tank VCO with PMOS transistor architecture, wherein the VCO circuit is coupled by two PMOS transistors to achieve the differential output effect.

FIG. 1C is a schematic circuit drawing of a conventional complementary transconductance coupling LC-tank VCO, wherein the VCO circuit is coupled by two PMOS transistors and two NMOS transistors to achieve the differential output effect.

(2) Balanced VCO, shown as FIG. 2. FIG. 2 is a schematic circuit drawing of a conventional balanced VCO, wherein a pair of half-circuits in the oscillator circuit is symmetrical to each other so as to achieve the differential output effect.

(3) Transformer-based VCO, shown as FIG. 3. FIG. 3 is a schematic circuit drawing of a conventional transformer-based VCO, wherein the coupling within a transformer of the oscillator circuit is used to produce the differential output.

In order to improve the phase noise of the above-mentioned conventional VCOs, the following schemes are usually utilized: (1) by improving the inductors or capacitors, for example, octagon inductors are preferably used to reduce the phase noise; (2) by choosing low-noise PMOS transistors as active devices, the phase noise thereof is improved; (3) by employing the inductors in transformer form, the output signal amplitude is enhanced; and (4) by disposing additional capacitors and inductors at the places where a second-harmonic occurs, the phase noise thereof is filtered and reduced.

Although the above-mentioned conventional schemes can improve the phase noise of a VCO, but the schemes also bring the new problems to the VCO that the circuit would occupy more area on a chip, increase power consumption and increase the difficulty of optimizing characteristics.

SUMMARY OF THE INVENTION

The present invention is to provide a VCO, which is capable of improving the phase noise thereof and effectively reducing the required circuit area.

The present invention provides a VCO, which includes a VCO circuit and a back-gate coupling circuit. The VCO circuit includes at least a first transistor, a second transistor and a resonant cavity formed by inductors and capacitors, while the back-gate coupling circuit is formed by a plurality of capacitors and a plurality of resistors. In the embodiment of the present invention, the above-mentioned capacitor is coupled between the first transistor and the back-gate terminal of the second transistor to reduce the power consumption and the phase noise.

Since the present invention utilizes the back-gate coupling scheme, the usage area of the MOS transistors thereof and the power consumption of the circuit itself can be reduced. In addition, the use of small size MOS transistors generate less phase noise. Therefore, the present invention is capable of reducing the phase noise.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
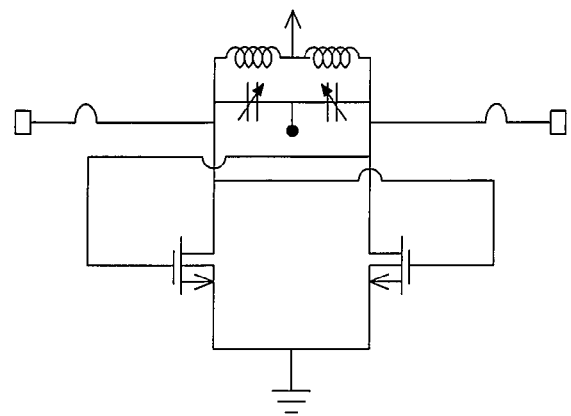
FIG. 1A is a schematic circuit drawing of a conventional transconductance coupling LC-tank VCO with NMOS transistor architecture.
Figure 1B:
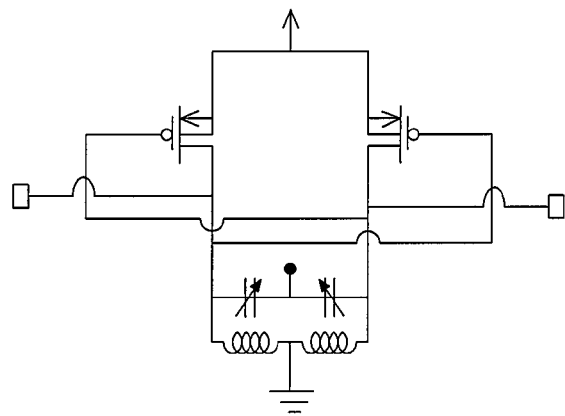
FIG. 1B is a schematic circuit drawing of a conventional transconductance coupling LC-tank VCO with PMOS transistor architecture.
Figure 1C:
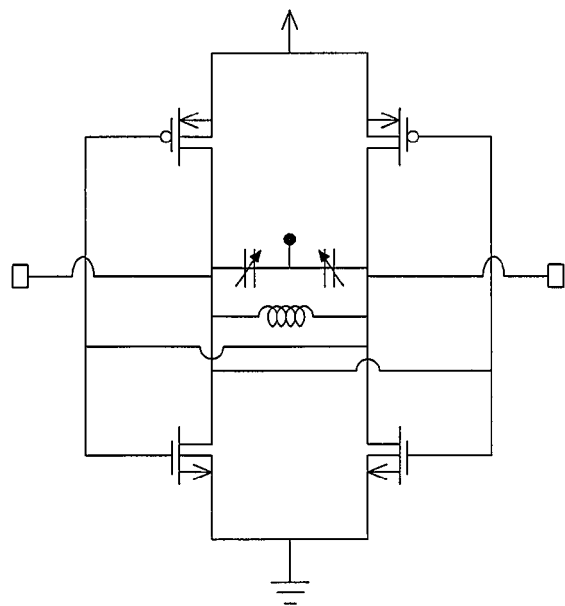
FIG. 1C is a schematic circuit drawing of a conventional complementary transconductance coupling LC-tank VCO.
Figure 2:
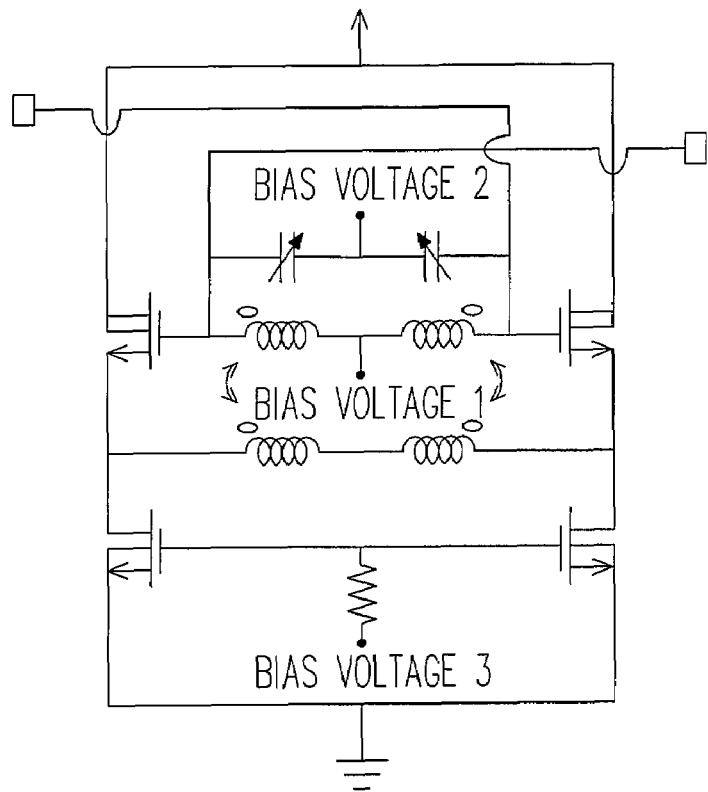
FIG. 2 is a schematic circuit drawing of a conventional balanced VCO.
Figure 3:
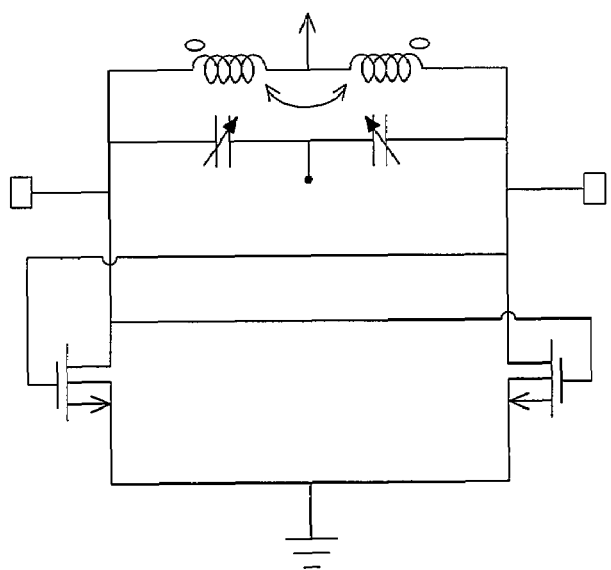
FIG. 3 is a schematic circuit drawing of a conventional transformer-based VCO.
Figure 4:
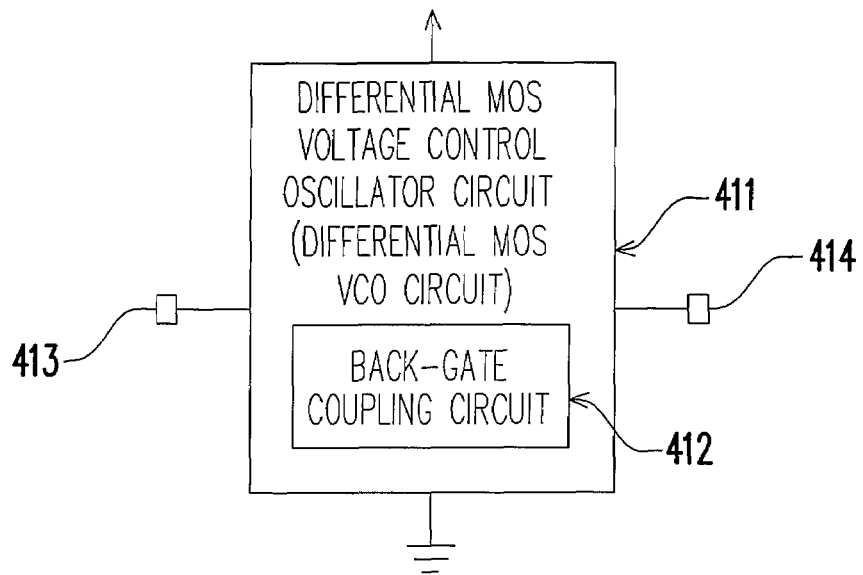
FIG. 4 is a circuit block diagram of a back-gate coupling VCO according to an embodiment of the present invention.

FIG. 4 is a circuit block diagram of a back-gate coupling VCO according to an embodiment of the present invention. Referring to FIG. 4, a back-gate coupling VCO includes a differential MOS VCO circuit block 411 and a back-gate coupling circuit block 412. The differential MOS VCO circuit block 411 is the major block of the entire oscillator circuit, which can be an LC-tank. VCO transconductance, coupled by NMOS transistors, an LC-tank VCO transconductance coupled by PMOS transistors, an n-p complementary transconductance coupling LC-tank VCO, a balanced VCO and a transformer-based VCO, wherein the above-mentioned types of VCO are intended for illustration of the present invention and is not intended to limit the scope of the present invention. In fact, an appropriate modification of the implementation on the differential MOS oscillator circuit block is allowed without departing from the scope of the present invention.

The back-gate coupling circuit block 412 can be formed by a plurality of capacitors and a plurality of inductors and is connected to the back-gates of the MOS transistors in the differential MOS VCO circuit block 411. The back-gate coupling VCO outputs signals from an output terminal 413 and an output terminal 414. Several embodiments of the present invention are provided in the following to explain the invention.

The First Embodiment

Figure 5:
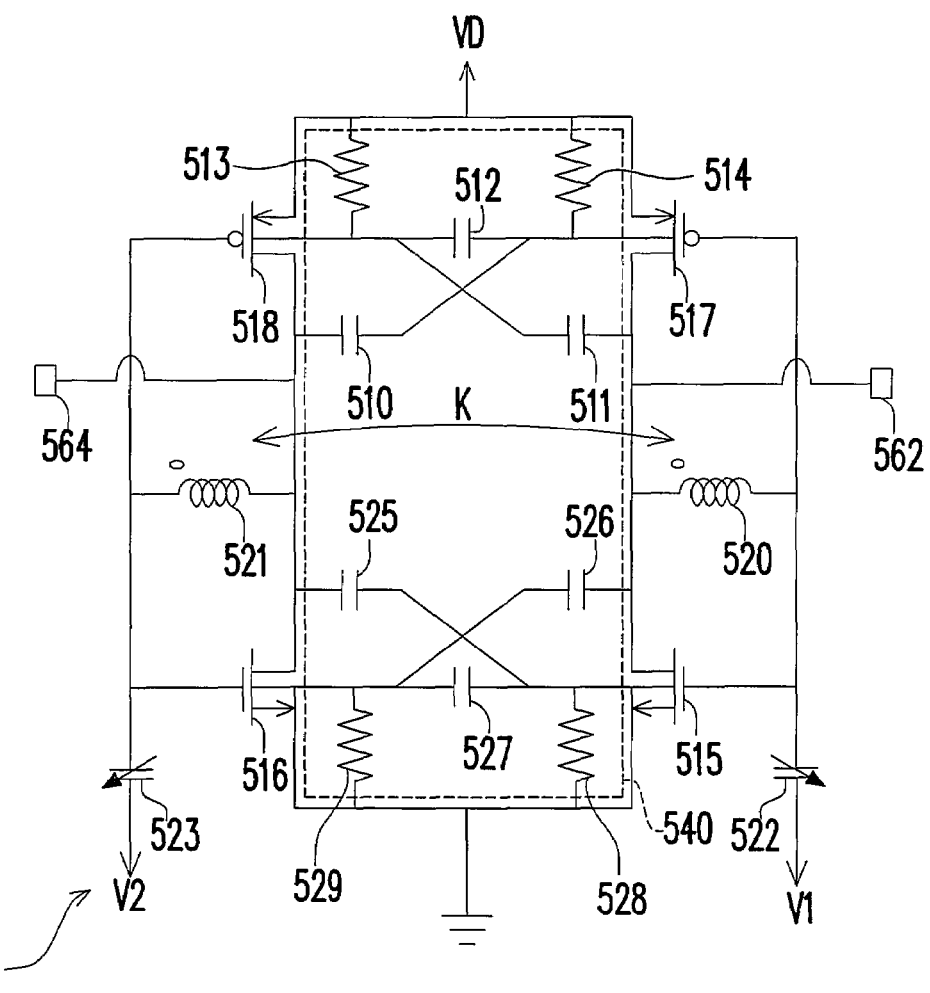
FIG. 5 is a schematic circuit drawing of a back-gate coupling VCO according to the first embodiment of the present invention.

FIG. 5 is a schematic circuit drawing of a back-gate coupling VCO according to the first embodiment of the present invention. Referring to FIG. 5, the VCO 500 provided by the embodiment is a combination of two complementary single-terminal Colpitts oscillators, wherein the inductors in the two oscillators are coupled to each other to form a transformer-based differential VCO.

In FIG. 5, the transformer-based differential VCO 500 includes a differential MOS VCO circuit formed by PMOS transistors 517 and 518 and NMOS transistors 515 and 516 and a back-gate coupling circuit 540. In the embodiment, the source of the NMOS transistor 515 is grounded, the gate terminal thereof is coupled to a bias voltage VI via a varactor 522 and the drain terminal thereof is coupled to the output terminal 562. Similarly, the source of the NMOS transistor 516 is grounded, the gate terminal thereof is coupled to a bias voltage V2 via a varactor 523 and the drain terminal thereof is coupled to the output terminal 564.

The drain terminal of the PMOS transistor 517 is coupled to the output terminal 562, the gate terminal thereof is coupled to the bias voltage VI via the varactor 522 and the source terminal thereof is coupled to a voltage source VD. Similarly, the drain terminal of the PMOS transistor 518 is coupled to the output terminal 564, the gate terminal thereof is coupled to the bias voltage V2 via the varactor 523 and the source terminal thereof is coupled to a voltage source VD.

The back-gate coupling circuit 540 also includes capacitors 525, 526 and 527 and resistors 528 and 529. The capacitor 526 is disposed between the back-gate terminal of the NMOS transistor 516 and the drain terminal of the NMOS transistor 515. Similarly, the capacitor 525 is disposed between the back-gate terminal of the NMOS transistor 515 and the drain terminal of the NMOS transistor 516, and the capacitor 527 couples the back-gate terminal of the NMOS transistor 515 to the back-gate terminal of the NMOS transistor 516. In addition, the resistors 528 and 529 respectively connect the back-gate terminals of the NMOS transistors 515 and 516 to the ground.

The back-gate coupling circuit 540 further includes capacitors 510, 511 and 512 and resistors 513 and 514. The capacitor 511 couples the drain terminal of the PMOS transistor 517 to the back-gate terminal of the PMOS transistor 518, and the capacitor 510 couples the drain terminal of the PMOS transistor 518 to the back-gate terminal of the PMOS transistor 517. In addition, the capacitor 512 is disposed between the back-gate terminals of the PMOS transistors 517 and 518.

In the embodiment, the VCO 500 further includes a transformer composed of two inductors 520 and 521, wherein the inductor 520 couples the drain terminal of the NMOS transistor 515 to the bias voltage V1, the inductor 521 is disposed at a side of the inductor 521 and couples the drain terminal of the NMOS transistor 516 to the bias voltage V2.

In summary, differential signals are able to be respectively transferred to the back-gate terminals of the NMOS transistors 515 and 516 via the capacitors 525 and 526, and the differential signals are able to be respectively transferred to the back-gate terminals of the PMOS transistors 517 and 518 via the capacitors 510 and 511, which further controls the on/off of the back-gate terminals.

It should be noted that the capacitors 527 and 512 are able to reduce the VCO phase noise, while the resistors 528, 529, 513 and 514 are high impedance resistors and serve as DC bias resistors to block any AC signal to the grounding terminal and the power supply terminal.

The Second Embodiment

Figure 6:
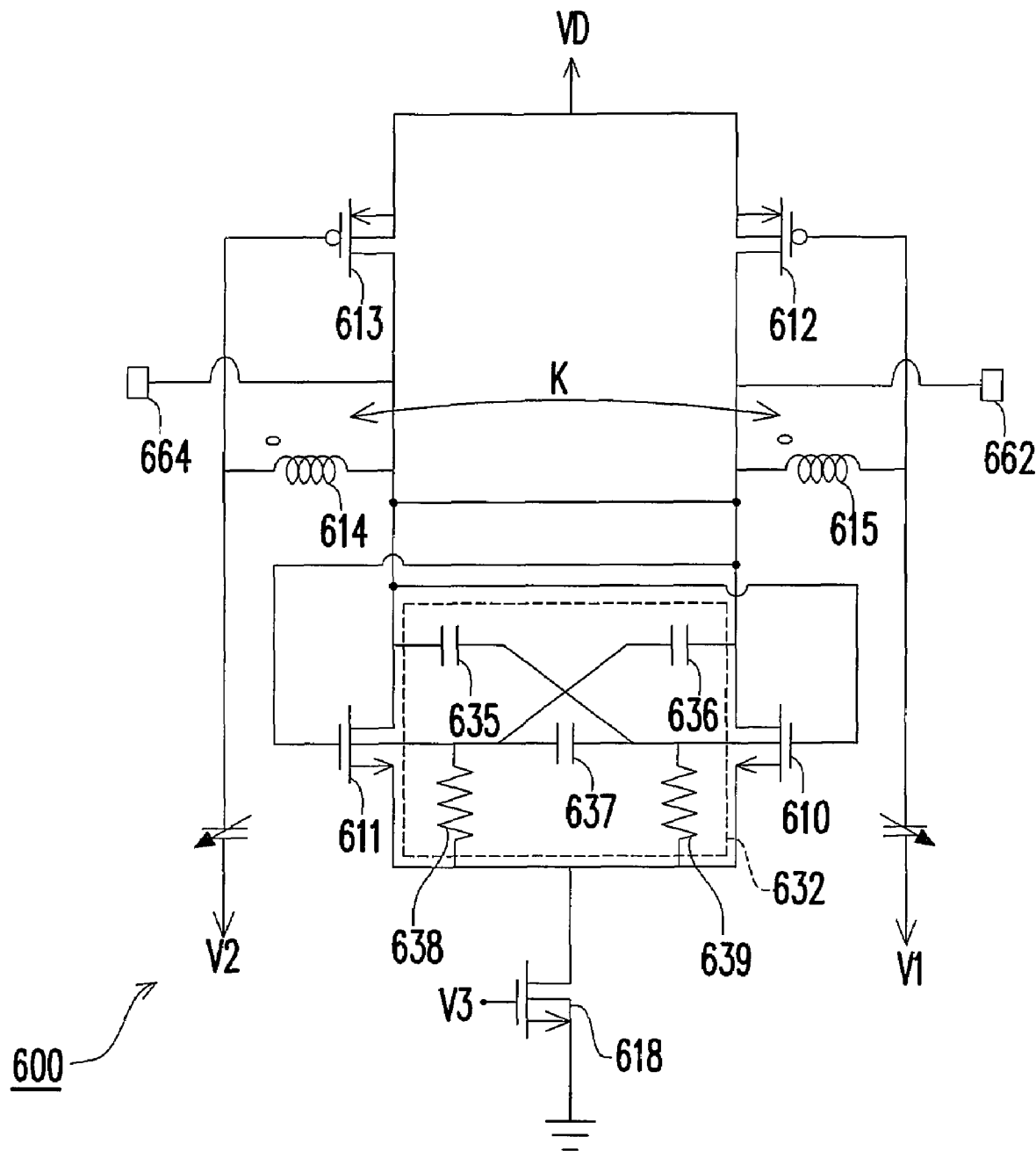
FIG. 6 is a schematic circuit drawing of a back-gate coupling VCO according to the second embodiment of the present invention.

FIG. 6 is a schematic circuit drawing of a back-gate coupling VCO according to the second embodiment of the present invention. Referring to FIG. 6, the VCO 600 provided by the embodiment is a differential oscillator composed of two PMOS single-terminal Colpitts oscillators, wherein the inductors in the two oscillators are coupled to each other and the NMOS transistors 610 and 611 are transconductance-coupled to each other, so as to form a transformer-based differential VCO.

The VCO 600 includes NMOS transistors 610, 611 and 618, PMOS transistors 612 and 613 and a back-gate coupling circuit 632. In the embodiment, the back-gate terminal and the source of the NMOS transistor 618 are grounded, the gate terminal thereof is coupled to a bias voltage V3 via and the drain terminal thereof is coupled to the source terminals of the NMOS transistors 610 and 611. The gate terminal of the NMOS transistor 610 is coupled to the drain terminal of the NMOS transistor 611 and to the output terminal 664. Similarly, the gate terminal of the NMOS transistor 611 is coupled to the drain terminal of the NMOS transistor 610 and to the output terminal 662.

In the embodiment, the coupling scheme between the PMOS transistors 612 and 613 and between the inductors 614 and 615 are similar to the coupling ways between the. PMOS transistors 517 and 518 and between the inductors 520 and 521 in FIG. 5, which can be deducted by anyone skilled in the field.

The back-gate coupling circuit 632 includes includes capacitors 635, 636 and 637 and resistors 638 and 639. The wirings between the above-mentioned components and the NMOS transistors 610 and 611 are similar to the wirings between the NMOS transistors 515 and 516 of the back-gate coupling circuit 540 in FIG. 5, except that in the embodiment, the resistor 639 couples the back-gate terminal of the NMOS transistor 610 to the source terminal of the NMOS transistor 610 and the resistor 638 couples the back-gate terminal of the NMOS transistor 611 to the source terminal of the NMOS transistor 611.

As described above, differential signal are able to be respectively transferred to the back-gate terminals of the NMOS transistors 610 and 611 via the capacitors 635 and 636, which further controls the on/off of the back-gate terminals. The capacitor 637 couples the NMOS transistor 610 to the NMOS transistor 611 to reduce the phase noise. Besides, the resistors 638 and 639 are high impedance resistors serves as DC bias resistors to block any AC signal to the grounding terminal and the power, supply terminal, while the NMOS transistor 618 is served as the current source component of the entire circuit.

The Third Embodiment

Figure 7:
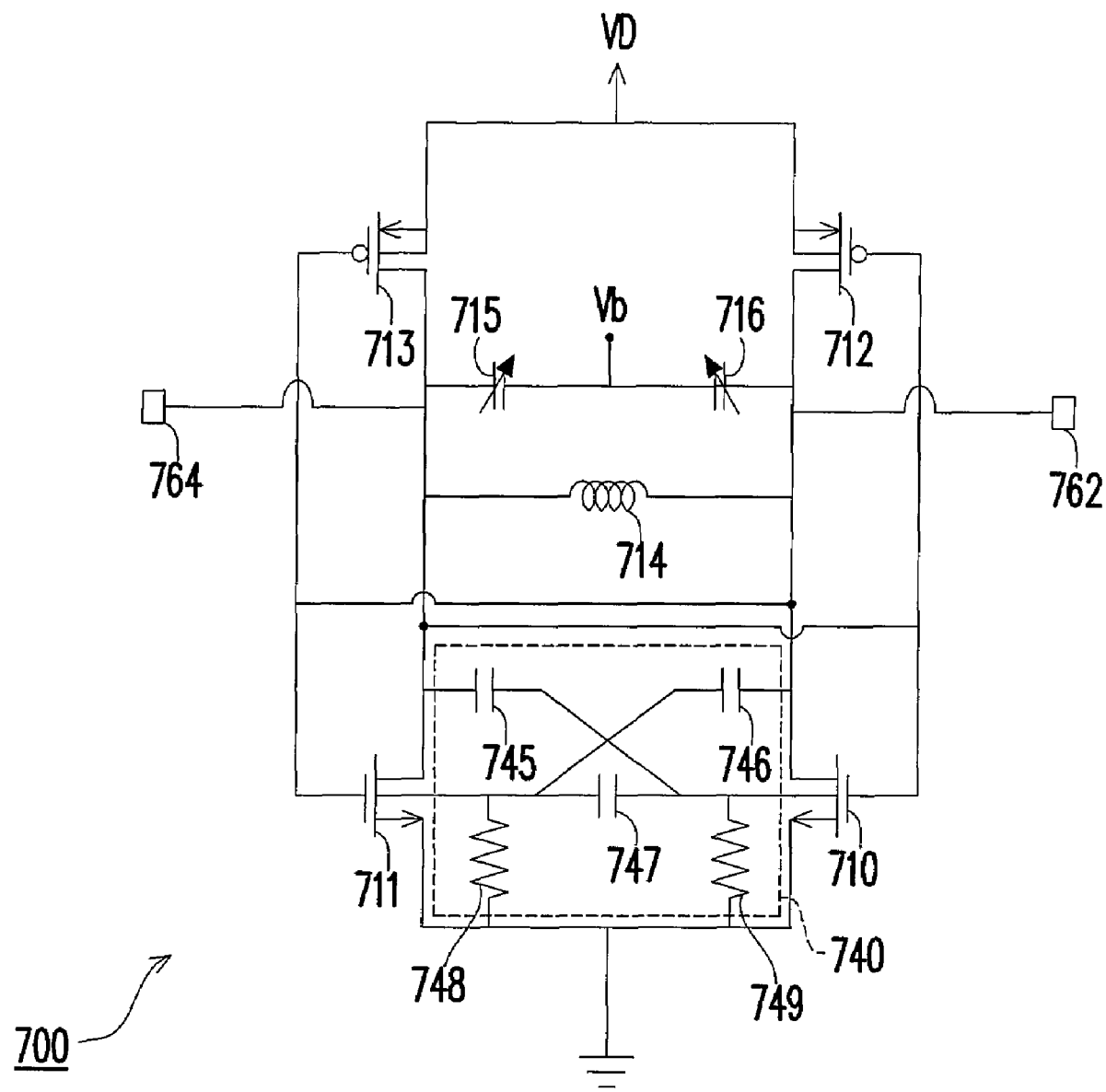
FIG. 7 is a schematic circuit drawing of a back-gate coupling VCO according to the third embodiment of the present invention.

FIG. 7 is a schematic circuit drawing of a back-gate coupling VCO according to the third embodiment of the present invention. Referring to FIG. 7, the VCO 700 provided by the embodiment also includes NMOS transistors 710 and 711, a VCO circuit formed by PMOS transistors 712 and 713 and a back-gate coupling circuit 740.

In FIG. 7, the source terminal of the PMOS transistor 710 is grounded, the drain terminal thereof is coupled to an output terminal 762 and the gate terminal thereof is coupled to the gate terminal of the PMOS transistor 712. Similarly, the source terminal of the PMOS transistor 711 is grounded, the drain terminal thereof is coupled to an output terminal 764 and the gate terminal thereof is coupled to the gate terminal of the PMOS transistor 713.

The drain terminal of the PMOS transistor 712 is coupled to the output terminal 762, while the source terminal and the back-gate terminal thereof are coupled to a voltage source VD. Similarly, the drain terminal of the PMOS transistor 713 is coupled to the output terminal 763, while the source terminal and the back-gate terminal thereof are together coupled to the voltage source VD.

The VCO 700 further includes varactors 715 and 716 and an inductor 714. In the embodiment, the varactor 716 is adapted for coupling the drain terminal of the PMOS transistor 712 to an input bias voltage Vb. Similarly, the varactor 715 is adapted for coupling the drain terminal of the PMOS transistor 713 to the input bias voltage Vb. Besides, the inductor 714 is disposed between the drain terminal of the PMOS transistor 712 and the drain terminal the PMOS transistor 713.

The back-gate coupling circuit 740 includes capacitors 745, 746 and 747 and resistors 748 and 749. The wirings and the operation principles of the components can be easily deduced by anyone skilled in the art by referring to the capacitors 525, 526 and 527 and the resistors 528 and 529 in FIG. 5; thus, for simplicity, description thereof is omitted.

The Fourth Embodiment

Figure 8:
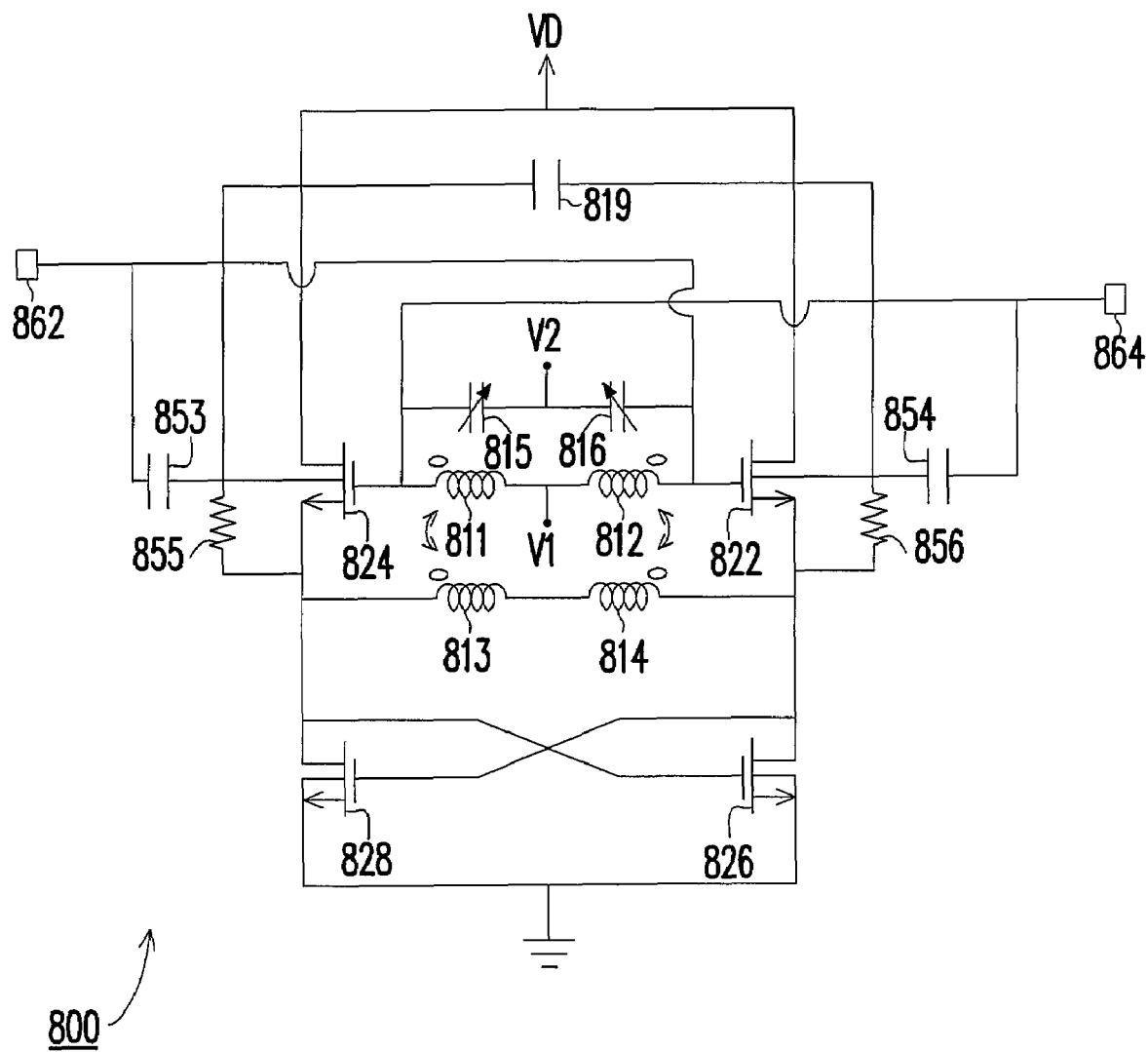
FIG. 8 is a schematic circuit drawing of a back-gate coupling VCO according to the fourth embodiment of the present invention.

FIG. 8 is a schematic circuit drawing of a back-gate coupling VCO according to the fourth embodiment of the present invention. Referring to FIG. 8, the VCO 800 provided by the embodiment includes a voltage control circuit formed by NMOS transistors 822, 824, 826 and 828 and a back-gate coupling circuit formed by inductors 811, 812, 813 and 814, varactors 815 and 816, capacitors 819, 853 and 854 and resistors 855 and 856.

In the embodiment, the back-gate terminal and the source terminal of the NMOS transistor 826 are grounded and the gate terminal thereof is coupled to the drain terminal of the NMOS transistor 825. Similarly, the back-gate terminal and the source terminal of the NMOS transistor 828 are grounded and the gate terminal thereof is coupled to the drain terminal of the NMOS transistor 826. Besides, the source terminals of the NMOS transistors 822 and 824 are respectively coupled to the drain terminals of the NMOS transistors 826 and 828, wherein the gate terminal of the NMOS transistor 822 is coupled to an output terminal 862, while the drain terminal thereof is coupled to a voltage source VD, and the gate terminal of the NMOS transistor 824 is coupled to an output terminal 864, while the drain terminal thereof is coupled to the voltage source VD as well.

In the back-gate coupling circuit, the inductor 812 is adapted for coupling the gate terminal of the NMOS transistor 822 to a bias voltage V1, while the inductor 811 is adapted for coupling the gate terminal of the NMOS transistor 824 to the bias voltage V1, and the inductors 813 and 814 are respectively disposed at a side of the inductor 811 and a side of the inductor 812 and connected in series to each other so as to couple the source terminal of the NMOS transistor 822 to the source terminal of the NMOS transistor 824.

In the VCO 800, the varactor 816 is adapted for coupling the gate terminal of the NMOS transistor 822 to a second bias voltage V2, while the varactor 815 is adapted for coupling the gate terminal of the NMOS transistor 824 to the second bias voltage V2.

In addition, the capacitor 854 is adapted for coupling the back-gate terminal of the NMOS transistor 822 to the output terminal 864 and the capacitor 853 is adapted for coupling the back-gate terminal of the NMOS transistor 824 to the output terminal 862.

In summary, since the present invention utilizes the back-gate coupling scheme to implement a novel LC-tank VCO capable of providing a differential output with low phase noise. Therefore, compared to the prior art, the present invention is superior in reducing the power consumption and the oscillator phase noise.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage control oscillator, comprising:
    a voltage control oscillator circuit, comprising at least a first transistor, a second transistor and a resonant cavity, wherein the resonant cavity comprises at least an inductor and a capacitor, and the voltage control oscillator circuit further comprising:
        a first capacitor, disposed between a first output terminal of the voltage control oscillator circuit and a back-gate terminal of the second transistor;
        a second capacitor, disposed between a second output terminal of the voltage control oscillator circuit and a back-gate terminal of the first transistor; and
        a third capacitor, disposed between the back-gate terminal of the first transistor and the back-gate terminal of the second transistor; and
    a back-gate coupling circuit, comprising at least a plurality of capacitors and a plurality of resistors, wherein the capacitors are respectively coupled to the back-gate terminals of the first transistor and the second transistor for reducing the power consumption and the phase noise of the voltage control oscillator.

2. The voltage control oscillator according to claim 1, wherein:
    the first transistor having a source terminal of is grounded and a drain terminal thereof is coupled to a first output terminal; and
    the second transistor having a source terminal of is grounded and a drain terminal thereof is coupled to a second output terminal.

3. The voltage control oscillator according to claim 2, wherein the resistors of the back-gate coupling circuit comprise:
- a first resistor, for grounding the back-gate terminal of the first transistor; and
- a second resistor, for grounding the back-gate terminal of the second transistor.

4. The voltage control oscillator according to claim 2, wherein the first transistor and the second transistor comprise NMOS transistors.

5. The voltage control oscillator according to claim 2, wherein the voltage control oscillator circuit further comprises:
- a third transistor, having a drain terminal is coupled to the first output terminal, a source terminal is coupled to a voltage source and a gate terminal is coupled to the gate terminal of the first transistor; and
- a fourth transistor, having a drain terminal is coupled to the second output terminal, a source terminal is coupled to the voltage source and a gate terminal is coupled to the gate terminal of the second transistor.

6. The voltage control oscillator according to claim 5, wherein the gate terminals of the first transistor and the third transistor are further coupled to a first bias voltage.

7. The voltage control oscillator according to claim 6, wherein the resonant cavity comprises:
- a first varactor, for coupling the gate terminals of the first transistor and the third transistor to the first bias voltage; and
- a second varactor, for coupling the gate terminals of the second transistor and the fourth transistor to the second bias voltage.

8. The voltage control oscillator according to claim 5, wherein the gate terminals of the second transistor and the fourth transistor are further coupled to a second bias voltage.

9. The voltage control oscillator according to claim 5, wherein the back-gate coupling circuit further comprises:
- a fourth capacitor, disposed between the first output terminal and the back-gate terminal of the fourth transistor;
- a fifth capacitor, disposed between the second output terminal and the back-gate terminal of the third transistor;
- a sixth capacitor, disposed between the back-gate terminal of the third transistor and the back-gate terminal of the fourth transistor;
- a third resistor, used for coupling the back-gate terminal of the third transistor to the voltage source; and
- a fourth resistor, used for coupling the back-gate terminal of the fourth transistor to the voltage source.

10. The voltage control oscillator according to claim 5, wherein the resonant cavity comprises:
- a first inductor, for coupling the first output terminal to the first bias voltage; and
- a second inductor, for coupling the second output terminal to the second bias voltage.

11. The voltage control oscillator according to claim 5, wherein the third transistor and the fourth transistor comprise PMOS transistors.

12. The voltage control oscillator according to claim 1, wherein the voltage control oscillator circuit further comprises a fifth transistor, wherein
- a source terminal and a back-gate terminal of the fifth transistor are grounded, a gate terminal thereof is coupled to a third bias voltage and a drain terminal thereof is coupled to the source terminals of the first transistor and the second transistor;
- the gate terminal of the first transistor is coupled to the drain terminal of the second transistor and the drain terminal of the first transistor is coupled to a first output terminal of the voltage control oscillator circuit; and
- the gate terminal of the second transistor is coupled to the drain terminal of the first transistor and the drain terminal of the second transistor is coupled to a second output terminal of the voltage control oscillator circuit.

13. The voltage control oscillator according to claim 12, wherein the back-gate coupling circuit further comprises:
- a first resistor, for coupling the back-gate terminal of the first transistor to the source terminal of the first transistor; and
- a second resistor, for coupling the back-gate terminal of the second transistor to the source terminal of the second transistor.

14. The voltage control oscillator according to claim 12, wherein the first transistor, the second transistor and the fifth transistor comprise NMOS transistors.

15. The voltage control oscillator according to claim 1, further comprising a sixth transistor and a seventh transistor, wherein:
- the source terminal and the back-gate terminal of the sixth transistor are grounded;
- a source terminal and a back-gate terminal of the seventh transistor are grounded, while a gate terminal and a drain terminal of the seventh transistor are respectively coupled to the drain terminal and the gate terminal of the sixth transistor;
- the source terminal of the first transistor is coupled to the drain terminal of the sixth transistor, the gate terminal of the first transistor is coupled to a first output terminal of the voltage control oscillator circuit and the drain terminal thereof is coupled to a voltage source; and
- the source terminal of the second transistor is coupled to the drain terminal of the seventh transistor, the gate terminal of the second transistor is coupled to a second output terminal of the voltage control oscillator circuit and the drain terminal thereof is coupled to the voltage source.

16. The voltage control oscillator according to claim 15, wherein the sixth transistor and the seventh transistor are NMOS transistors.

17. The voltage control oscillator according to claim 15, wherein the back-gate coupling circuit further comprises:
- a sixth capacitor, disposed between the first output terminal and the back-gate terminal of the fourth transistor;
- a seventh capacitor, disposed between the back-gate terminal of the second transistor and the first output terminal;
- an eighth capacitor, respectively coupled to the source terminal of the first transistor via a third resistor and the source terminal of the second transistor via a fourth resistor.

18. The voltage control oscillator according to claim 17, wherein the back-gate coupling circuit further comprises:
- a fourth inductor, for coupling the gate terminal of the first transistor to a first bias voltage;
- a fifth inductor, disposed at a side of the fourth inductor;
- a sixth inductor, for coupling the gate terminal of the second transistor to the first bias voltage;
- a seventh inductor, disposed at a side of the sixth inductor, connected in series to the fifth inductor and coupling the source terminal of the first transistor to the source terminal of the second transistor;
- a third varactor, for coupling the gate terminals of the first transistor to a second bias voltage; and
- a fourth varactor, for coupling the gate terminals of the second transistor to the second bias voltage.

* * * * *